(12) United States Patent
Nogome et al.

(10) Patent No.: US 7,012,337 B2
(45) Date of Patent: Mar. 14, 2006

(54) SEMICONDUCTOR DEVICE INCLUDING A PHOTOSENSITIVE RESIN COVERING AT LEAST A PORTION OF A SUBSTRATE HAVING A VIA HOLE

(75) Inventors: Masanobu Nogome, Bizen (JP); Akiyoshi Tamura, Suita (JP); Keiichi Murayama, Okayama (JP); Kazutsune Miyanaga, Okayama (JP); Yoshitaka Kuroishi, Bizen (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 38 days.

(21) Appl. No.: 10/630,900

(22) Filed: Jul. 31, 2003

(65) Prior Publication Data

US 2004/0021153 A1  Feb. 5, 2004

(30) Foreign Application Priority Data

Aug. 1, 2002  (JP) ............................. 2002-224554
Jun. 18, 2003  (JP) ............................. 2003-174015

(51) Int. Cl.
*H01L 23/48* (2006.01)

(52) U.S. Cl. ...................... 257/774; 257/664; 257/724; 257/728; 257/482; 257/662; 522/18

(58) Field of Classification Search ................ 257/664, 257/724, 728, 482, 662; 522/18
See application file for complete search history.

(56) References Cited

U.S. PATENT DOCUMENTS 4,902,726 A * 2/1990 Hayashi et al. ................ 522/18
5,528,074 A * 6/1996 Goto et al. .................. 257/664

FOREIGN PATENT DOCUMENTS

JP  2001-110897  4/2001

* cited by examiner

*Primary Examiner*—Mai-Huong Tran
(74) *Attorney, Agent, or Firm*—Wenderoth, Lind & Ponack, L.L.P.

(57) ABSTRACT

A semiconductor device includes a substrate with a via hole. An electrode is formed on a surface of the substrate so that a portion of the electrode extends through the via hole. A photosensitive resin is formed over the surface so as to cover an aperture of the via hole.

7 Claims, 5 Drawing Sheets

SEMICONDUCTOR DEVICE INCLUDING A PHOTOSENSITIVE RESIN COVERING AT LEAST A PORTION OF A SUBSTRATE HAVING A VIA HOLE

BACKGROUND OF THE INVENTION (1) Field of the Invention

The present invention relates to manufacturing of a semiconductor chip, and especially to a semiconductor device that prevents a defect at the time of manufacturing by filling in resin into a via hole of a semiconductor chip and its manufacturing method.

(2) Description of the Related Art

Up to now, a compound semiconductor device made of Field Effect Transistors (hereinafter, referred to as FET) or hetero bipolar transistors (hereinafter, referred to as HBT) has long been used as a high output power amplifier for transmission in a part of a cell phone, in which outstanding characteristics such as high output, high gain and low distortion are required. To meet this requirement, and especially to earn higher gain, together with upgrading a semiconductor element such as an FET, in a manufacturing process, a ground wiring is not pulled out from an electrode pad on a chip by a wire, but through a via hole that penetrates the chip from the reverse side. When a source electrode of an FET for amplification is grounded using this technique, it is possible to significantly reduce parasitic source inductance and increase a gain of a power amplifier.

Hereinafter, a manufacturing method of a semiconductor device having a via hole structure is explained using a cross-sectional view shown in FIG. 1.

For a start, as shown in FIG. 1A, on a surface of a GaAs substrate 100 on which a circuit made up of an FET, resistance, a capacitor and an inductor is formed, a hole 110 to be a via hole is formed with a depth of about 150 $\mu$m. Then, after Au plating 120 is formed on a part of an electrode and the hole 110 to be the via hole, a protective film 130 is formed on the top surface. At this time, it is more advantageous to form the hole 110 to be the via hole on the surface of the GaAs substrate than on the reverse side of the GaAs substrate in terms of simplicity of process.

Next, as shown in FIG. 1B, the hole 110 to be the via hole is penetrated by grinding the GaAs substrate 100 so that the substrate becomes an approximate 100 $\mu$m-thin film and so that a via hole 140 is formed. Then, laminated metals, Cr and Au, are evaporated on the reverse side of the GaAs substrate 100 and a reverse electrode 150 is formed. Then, although it is not illustrated, the GaAs substrate 100 is dice-cut into chips.

Next, as shown in FIG. 1C, a chip is dice-bonded on an assembly substrate 160 via an adhesive metal 170, either Ag paste or AuSn paste.

In the process of dice-bonding the chip included in the manufacturing method of the semiconductor device, the adhesive metal 170 spurts out from the via hole 140 and pollutes a circuit on the surface of the chip.

As a prior art arrangement to solve this problem, "Manufacturing Method of Semiconductor device" (refer to Japanese Laid-Open Patent application No. 2001-110897) was developed. According to that reference, in the manufacturing method shown in FIG. 1A, the hole 110 to be the via hole is filled in with photocuring resin. In the process shown in FIG. 1B, a reverse side electrode is formed all over the reverse side of the GaAs substrate 100 including a via hole aperture, which is covered with the reverse side electrode, and then the photocuring resin is removed with organic solvent. Thus, spurting out of the adhesive metal 170 at the time of dice-bonding is prevented.

In the conventional manufacturing method of a semiconductor device, however, the GaAs substrate is soaked in organic solvent and dried when the photocuring resin is removed, so there is a problem in that it is difficult to handle the GaAs substrate because it becomes a thin film and breaks. Additionally, in the conventional manufacturing method of the semiconductor device, the spurting out of the adhesive metal is prevented by the reverse side electrode. However, there is a problem in that when the reverse side electrode is thin, it is not sufficient to cover the via hole aperture; holes open up in the reverse side electrode; and the adhesive metal spurts out. On the other hand, when the reverse side electrode is thick, it is difficult to dice-cut. Furthermore, in the conventional method of manufacturing the semiconductor device, the photocuring resin fills in only the via hole, and the via hole aperture on the surface of the GaAs substrate is not fully covered with the photocuring resin. In that case, there is a problem in that when the adhesion between the plating on the sidewall of the via hole and the photocuring resin is weak, the spurting out of the reverse side metal to the surface of the chip occurs at the time of the vapor deposition of the reverse side electrode.

SUMMARY OF THE INVENTION

To achieve the object, the semiconductor according to the present invention is a semiconductor device that includes a semiconductor substrate having a via hole that penetrates the semiconductor substrate from a surface to a reverse side. A part of an electrode formed on the surface of the semiconductor substrate reaches the reverse side of the semiconductor substrate through the via hole, and an inside of the via hole is filled in with a photosensitive resin to fully cover an aperture of the via hole on the surface of the semiconductor substrate. Here, it is acceptable that a main ingredient of the photosensitive resin is silicone resin or epoxy resin, and that viscosity of the photosensitive resin at 25° is 70~600 m Pa·s. Thus, since the via hole of the semiconductor substrate is filled in with the photosensitive resin and the photosensitive resin is not removed, a semiconductor device that has no spurting out of an adhesive metal and prevents a defect at the time of manufacturing is achieved.

Additionally, it is tolerable that the photosensitive resin is filled in more shallowly than the depth of the via hole. Thus, when the semiconductor substrate is grinded to form the via hole, the photosensitive resin has no influence. Therefore, an effect to realize a low-cost semiconductor device that significantly reduces damage such as yield is achieved.

Moreover, the present invention may be a manufacturing method of a semiconductor including a semiconductor substrate having a via hole that penetrates the semiconductor substrate from a surface to a reverse side and a substrate for assembly connected to the reverse side of the semiconductor substrate via an adhesive metal. The manufacturing method comprises a photosensitive resin filling process of rotating the semiconductor substrate, applying a photosensitive resin to a surface of the semiconductor substrate on which a hole to be a via hole is formed, and filling in an inside of the hole to be the via hole with the photosensitive resin to fully cover an aperture of the hole to be the via hole. The method further comprises a photosensitive resin flattening process of rotating the semiconductor substrate and flattening the photosensitive resin on the surface of the semiconductor substrate. The reverse side of the semiconductor substrate is ground until the hole to be the via hole appears and the via hole is formed, and a reverse side electrode is formed on the semiconductor substrate. The semiconductor substrate is divided chip by chip, and the divided semiconductor substrate is laid on the substrate for assembly via an adhesive metal.

Here, it is satisfactory that a photosensitive resin whose main ingredient is silicone resin or epoxy resin is applied in the photosensitive resin filling process, that a photosensitive resin whose viscosity at 25° is 70~600 m Pa·s is applied in the photosensitive resin filling process, and that the adhesive metal is either Ag paste or AuSn paste, and chips are laid on the substrate for assembly via either Ag paste or AuSn paste in the laying process.

Furthermore, it is acceptable that the semiconductor substrate is rotated at 200~900 rpm in the photosensitive resin filling process, and the semiconductor substrate is rotated so that a film thickness of the surface of the photosensitive resin becomes 4~10 µm in the photosensitive resin flattening process and that a photosensitive resin whose viscosity at 25° is 70~600 m Pa·s is applied in the photosensitive resin filling process.

Since the adhesive metal does not spurt out when the chips are laid on the substrate for assembly and it is not necessary to add a process to remove the photosensitive resin, a manufacturing method of a semiconductor that has no spurting out of an adhesive metal and prevents a defect at the time of manufacturing is achieved.

As further information about technical background to this application, Japanese patent application No. 2002-224554 filed on Aug. 1, 2002 is incorporated herein by reference.

BRIEF DESCRIPTION OF THE DRAWINGS

These and other subjects, advantages and features of the invention will become apparent from the following description thereof taken in conjunction with the accompanying drawings that illustrate a specific embodiment of the invention.

DESCRIPTION OF THE PREFERRED EMBODIMENT(S)

The semiconductor device according to the present embodiment of the present invention will be explained below with reference to the figures.

Figure 1A:
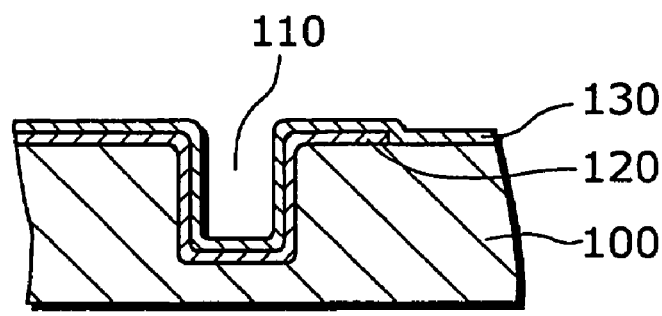
FIG. 1A~1C are cross-sectional views of a semiconductor device that has a conventional via hole structure showing a manufacturing method of the semiconductor device.
Figure 1B:
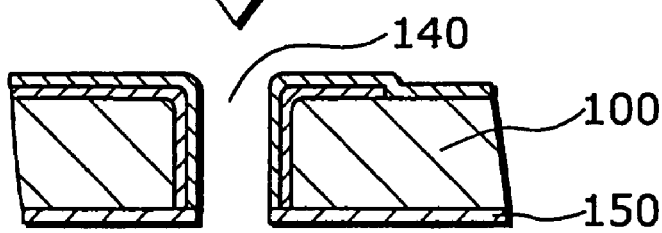
Figure 1C:
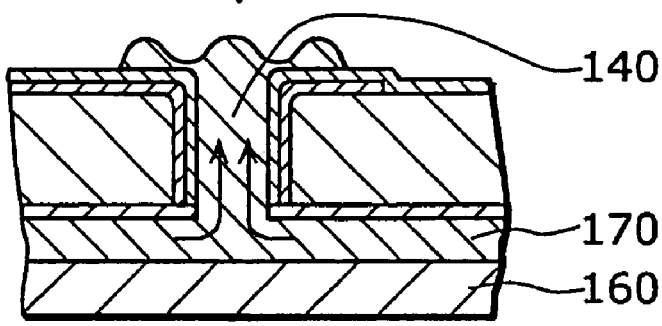
Figure 2:
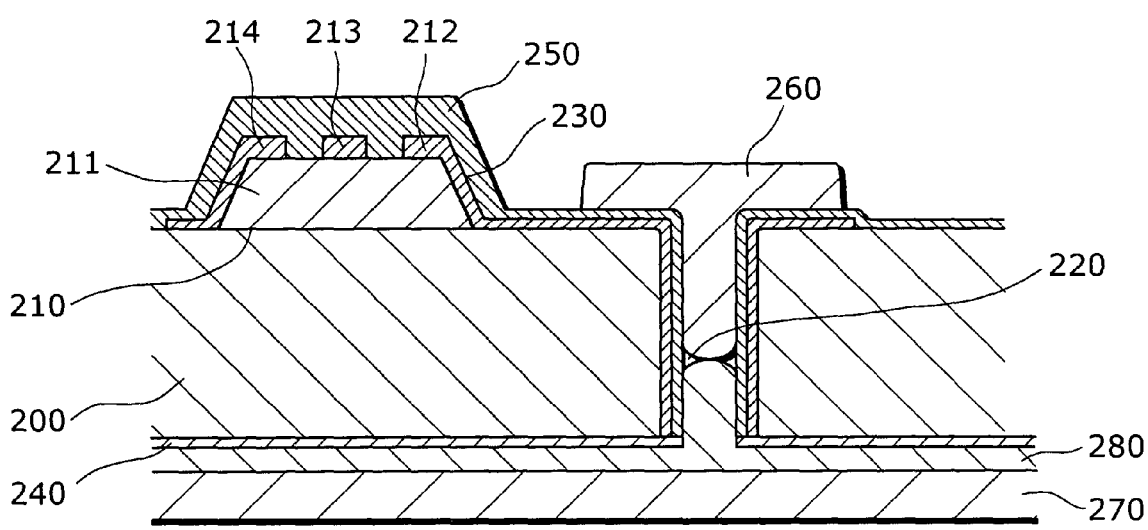
FIG. 2 is a cross-sectional view of a semiconductor device according to the embodiment of the present invention.

FIG. 2 is a cross-sectional view in outline of a semiconductor device according to an embodiment of the present invention.

The semiconductor device according to the present embodiment aims to realize a semiconductor device that has no spurting out of an adhesive metal and prevents a defect at the time of manufacturing. The semiconductor device is made up of a GaAs substrate 200 that is a semiconductor substrate; a semiconductor element 210; a via hole 220 that is 70 µmφ in diameter and penetrates the GaAs substrate 200 from the surface (first side) to the reverse (second side) side; Au plating 230 that grounds a source electrode 212 to the reverse (second) side of the GaAs substrate 200 through the via hole 220; a reverse side electrode 240 made of laminated metals of Cr and Au; a protective film 250; a negative-type photosensitive silicone resist 260 that has a 4~10 µm-film thickness in the vicinity of the via hole 220 on the surface (first side) of the GaAs substrate 200, fills in the via hole 220 to a depth of about 30 µm, and prevents the spurting out of the adhesive metal at the time of dice-bonding; an assembly substrate 270 that is a lead frame; and an adhesive metal 280 that is either Ag paste or AuSn paste and bonds the assembly substrate 270 and the GaAs substrate 200. The GaAs substrate 200 may also be another semiconductor substrate such as an InP substrate, a GaN substrate, a compound semiconductor substrate or an Si substrate. Additionally, the Au plating 230 is described to ground a source electrode 212 to the reverse (second) side of the GaAs substrate 200, but the Au plating 230 may ground another electrode formed on the surface (first side) of the GaAs substrate 200 to the reverse (second) side of the GaAs substrate 200 or a plurality of electrodes to the reverse side of the GaAs substrate 200.

Here, the semiconductor element 210 is a three-terminal element such as a bipolar transistor, an FET or an HBT, and is made up of an element region 211, a source electrode 212, a gate electrode 213 and a drain electrode 214. Although the semiconductor element 210 is described as the three-terminal element, it may also be a two-terminal element such as a laser diode, a rectification diode or a multi-terminal element; it may be an integrated circuit made up of a plurality of semiconductor elements, an analogue integrated circuit including an inductor and a capacitor or a microwave integrated circuit including an inductor and a capacitor.

Moreover, the photosensitive silicone resist 260 is a silicone resin whose main ingredient is siloxane resin manufactured by Shin-Etsu Chemical Co., Ltd. (product name: SINR-3170-7.0 or SINR-3170L-7.0). The photosensitive silicone resist 260 may also be an ultraviolet curing resin whose main ingredient is epoxy resin. Furthermore, the photosensitive silicone resist 260 may be a positive type.

Figure 3:
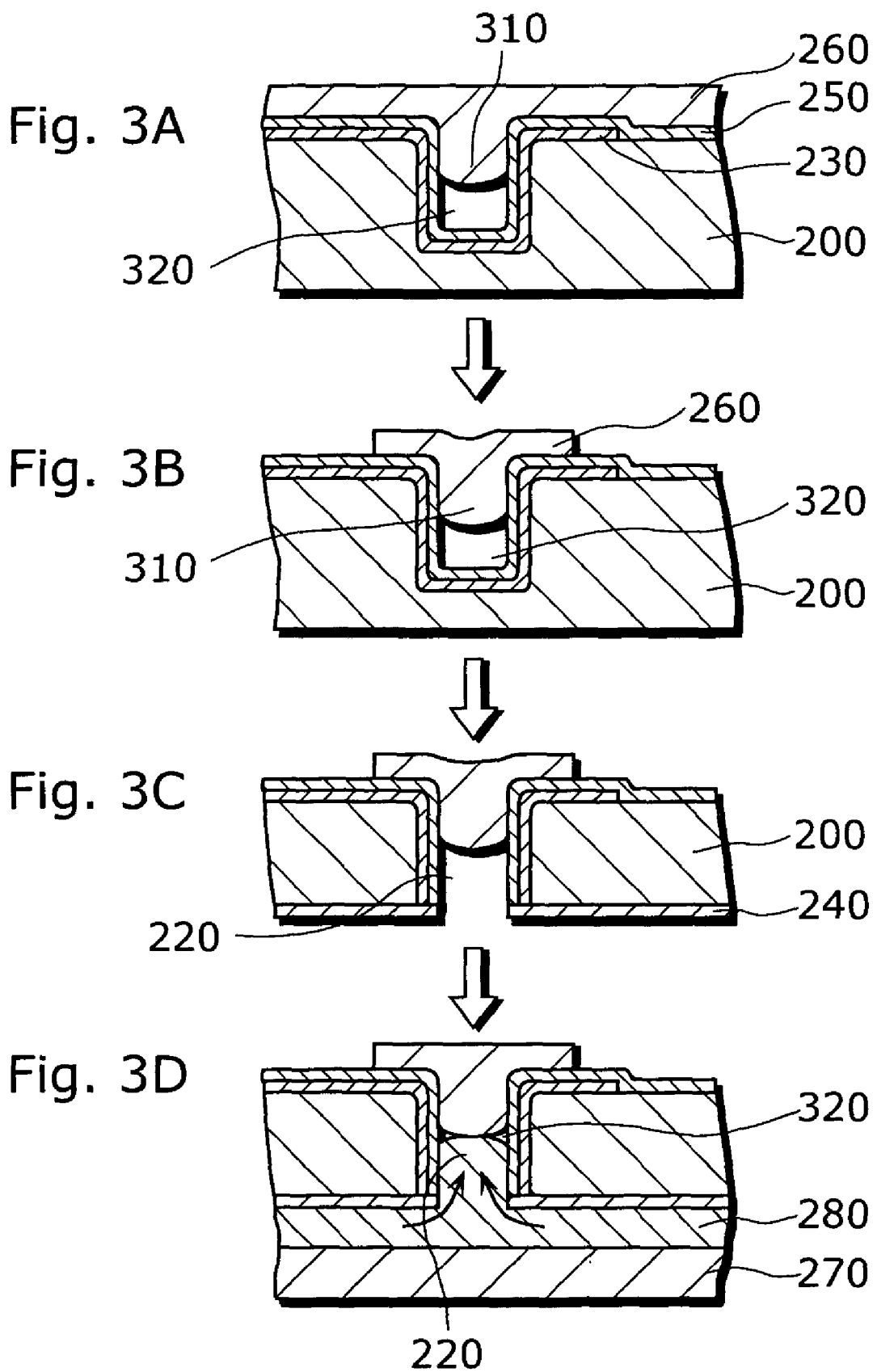
FIG. 3A~3D are cross-sectional views of the semiconductor device showing a manufacturing method of the semiconductor device.
Figure 4:
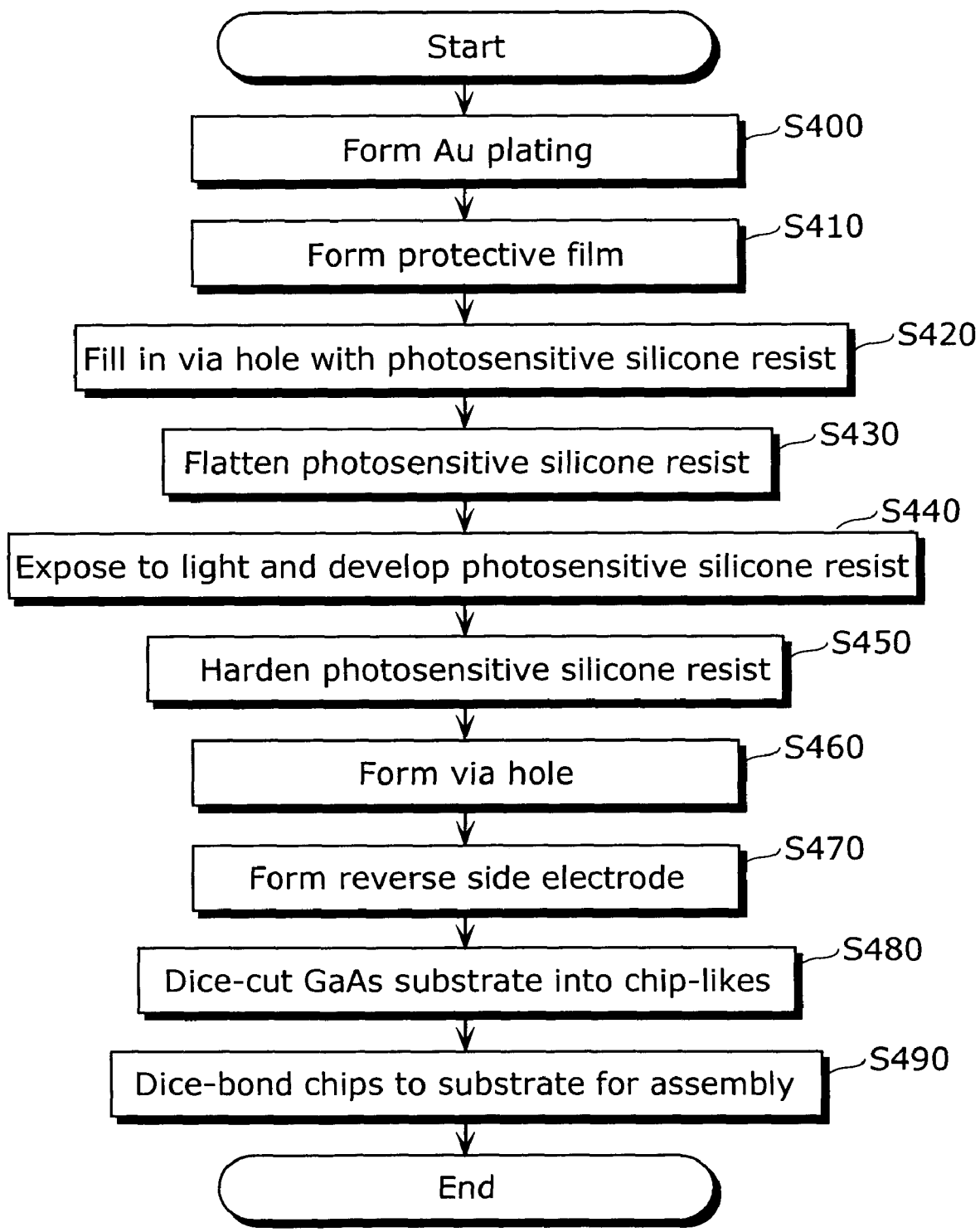
FIG. 4 is a flowchart showing the manufacturing method of the semiconductor device according to the present embodiment.

Next, a manufacturing method of a semiconductor device having the structure described above is explained according to a cross-sectional view shown in FIG. 3 and a flowchart shown in FIG. 4.

It should be noted that the same component parts as in FIG. 2 are given the same numbers and a detailed explanation of them is omitted here.

For a start, as shown in FIG. 3A, after a hole 310 to be a via hole is formed with a depth of 150 µm on the first-side surface of the GaAs substrate 200 on which the semiconductor elements (not illustrated) are formed, the Au plating 230 is formed on a part of an electrode and the hole 310 to be the via hole that are formed on the first-side surface of the GaAs substrate 200 (Step S400). Then, the protective film 250 that covers the semiconductor elements and the Au plating 230 is formed (Step S410). Then, after the GaAs substrate 200 is rotated using a spin coat with a low speed of about 750 rpm and the photosensitive silicone resist 260 is applied to the surface of the GaAs substrate 200 in which the hole 310 to be the via hole is formed, the GaAs substrate 200 is rotated for about one minute, and the hole 310 to be the via hole is filled in with the photosensitive silicone resist 260 to a depth of about 30 μm (Step S420). Then, the GaAs substrate 200 is further rotated at a speed of about 3000 rpm for 20 seconds to flatten the photosensitive silicone resist 260 on the GaAs substrate 200 to about a 7 μm-film thickness (Step S430). At this time, since the hole 310 to be the via hole is filled in with the photosensitive silicone resist 260 to a depth of about 30 μm, a cavity 320 with a depth of about 120 μm from the bottom of the photosensitive silicone resist 260 is created. By the way, at the time of flattening the photosensitive silicone resist 260, the GaAs substrate 200 is rotated at the speed of 3000 rpm for 20 seconds, but it is acceptable to rotate the GaAs substrate at another speed (rpm) and for other length of time as long as the photosensitive silicone resist 260 with good in-plane evenness in 4~10 μm-film thickness is formed on the surface of the GaAs substrate 200. Additionally, when the hole 310 to be the via hole is filled in with the photosensitive silicone resist 260, the GaAs substrate is rotated at about 750 rpm, but it is acceptable to rotate the GaAs substrate at 200 rpm or more and 900 rpm or less, further preferably at 500 rpm or more and 800 rpm or less, as long as the hole 310 to be the via hole is filled in with the photosensitive silicone resist 260 at a depth of 20 μm or more.

Next, as shown in FIG. 3B, the photosensitive silicone resist 260 is exposed to light, developed, and left so that it fully covers the aperture of the hole 310 to be the via hole (Step S440). As illustrated in FIG. 3B, the photosensitive resin 260 covers an area on the first-side surface of substrate 200 that is larger than the area of the aperture of hole 310 and that includes the aperture of hole 310. At this time, since the film thickness of the photosensitive silicone resist 260 is 4~10 μm on the surface of the GaAs substrate 200, there is not a problem in that the development is difficult because the film thickness is too thick. In addition, the development is done by dipping the photosensitive silicone resist 260 in developer, IPA (isopropyl alcohol) or ethyl lactate after baking the photosensitive silicone resist 260 at 90° C. for 120 seconds. Then, the photosensitive silicone resist 260 is baked at about 200° for 60 minutes and hardened (Step S450). Since the baking temperature is low, there is no influence of the temperature on the character of the semiconductor element.

Here, when the viscosity of the photosensitive silicone resist 260 is too high, two problems occur: (1) when the photosensitive silicone resist 260 is developed, it remains on the electrode part and the like on the GaAs substrate 200 after the development and the semiconductor device becomes defective; and (2) when the photosensitive silicone resist 260 fills in the hole 310 to be the via hole, the filling-in cannot be fully performed. Therefore, it is impossible to fully close the hole 310 to be the via hole with the photosensitive silicone resist 260. On the other hand, when the viscosity of the photosensitive silicone resist 260 is too low, two problems also occur: (1) when the photosensitive silicone resist 260 is flattened, the film thickness of the photosensitive silicone resist 260 on the surface of the GaAs substrate becomes thin or even disappears, so that it is impossible to fully cover the aperture of the hole 310 to be the via hole with the photosensitive silicone resist 260; and (2) when the photosensitive silicone resist 260 fills in the hole 310 to be the via hole, the silicone resist 260 fully fills the hole so that the cavity 320 is not created. Consequently, the viscosity of the photosensitive silicone resist 260 at 25° is determined to be 450 m Pa·s. It is acceptable that the viscosity of the photosensitive silicone resist 260 at 25° is in a range of 70~600 m Pa·s.

Next, as shown in FIG. 3C, the hole 310 to be the via hole is penetrated by grinding the GaAs substrate into a thin film with a thickness of about 100 μm, and the via hole 220 is formed (Step S460). Then the reverse (second) side electrode 240 is formed by evaporating the laminated metals, Cr and Au, on the reverse (second) side of the GaAs substrate 200 (Step S470). Then, although not illustrated, the GaAs substrate 200 is dice-cut into chips (Step S480).

Next, as shown in FIG. 3D, the chips are dice-bonded to the assembly substrate 270 on which the adhesive metal 280 is applied in advance (Step S490). At this time, the adhesive metal 280 is pressed by the chips and enters into the via hole 220, but the adhesive metal 280 stops after entering a part of the cavity 320 and does not spurt out to the surface of the chip because there is about a 70 μm-difference between the lower side of the photosensitive silicone resist 260 and the reverse (second) side of the GaAs substrate 200.

Figure 5:
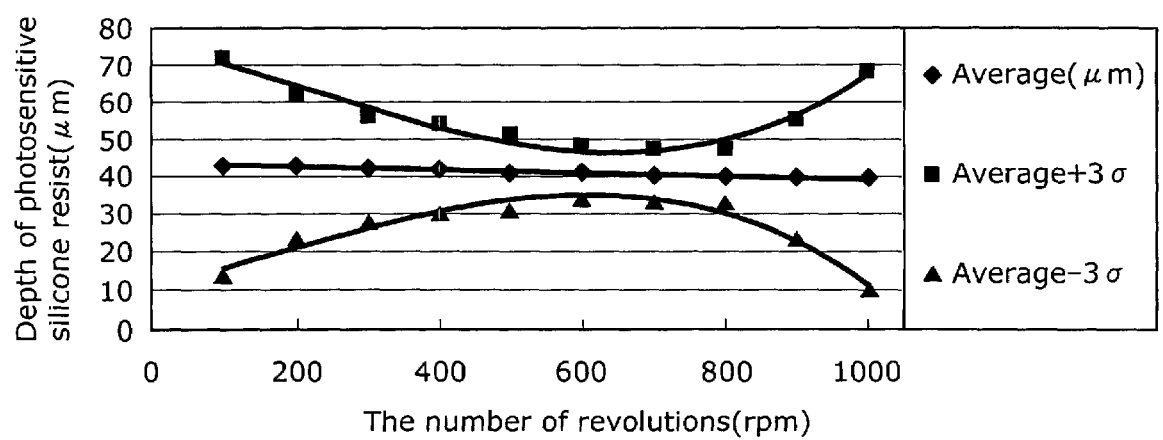
FIG. 5 is a graph showing the relationship between the depth of the photosensitive silicone resist 260 that fills in the hole 310 to form the via hole and the number of revolutions (rpm) when the number of revolutions (rpm) is changed at S420 in the flowchart of FIG. 4.

FIG. 5 is a graph showing the relationship between the depth of the photosensitive silicone resist 260 that fills in the hole 310 to be the via hole and the number of revolutions (rpm) when the number of revolutions (rpm) is changed at S420 in the flow chart of FIG. 4 showing the manufacturing method of the semiconductor device.

It can be understood from FIG. 5 that when the number of revolutions (rpm) is 200 rpm or more and 900 rpm or less, the photosensitive silicone resist 260 with a depth of 20 μm or less is outside of the ±3 σ-range. When the number of revolutions (rpm) is 500 rpm or more and 800 rpm or less, the photosensitive silicone resist 260 with the depth outside of 40 μm±25% (10 μm)-range is outside of the ±3 σ-range. The present invention achieves results like this. To prevent the spurting out of the adhesive metal 280, it is necessary that the photosensitive silicone resist 260 is 20 μm in depth inside of the via hole 220, and it is preferable that the photosensitive silicone resist 260 is 40 μm±25% in depth. Therefore, the number of revolutions (rpm) is described to be 200 rpm or more and 900 rpm or less, and preferably 500 rpm or more and 800 rpm or less.

As is described above, according to the present embodiment, the semiconductor device has the photosensitive silicone resist within the via hole. Consequently, it is possible to prevent the spurting out of the adhesive metal that occurs when the chips are dice-bonded on the substrate for assembly. Therefore, the semiconductor device according to the present embodiment can realize a semiconductor that has no spurting out of an adhesive metal and its manufacturing method.

Additionally, according to the present embodiment, the photosensitive silicone resist in the via hole is not removed. As a result, since the process to remove the photosensitive silicone resist is not necessary, the semiconductor device according to the present embodiment can realize a semiconductor device that prevents a defect at the time of manufacturing and its manufacturing method.

Moreover, according to the present embodiment, the photosensitive silicone resist fills in the via hole so that a cavity is formed in the hole to be the via hole. Consequently, the photosensitive silicone resist does not have a bad influence that occurs at the time of grinding the GaAs substrate such as grinding unevenness resulting from a difference in hardness of the photosensitive silicone resist and the GaAs substrate. Therefore, the semiconductor device according to the present embodiment significantly reduces damage of yield and the like and can realize a low-cost semiconductor device and its manufacturing method.

Furthermore, according to the present embodiment, the aperture of the via hole on the surface of the GaAs substrate is fully covered by the photosensitive silicone resist. As a result, since the spurting out of the adhesive metal at the time of dice-bonding is completely preventable, the semiconductor device according to the present embodiment can realize a semiconductor that has completely no spurting out of an adhesive metal and its manufacturing method.

In the present embodiment, the lead frame is exemplified as the substrate for assembly and it is described that the chips are dice-bonded on the lead frame. However, the substrate for assembly is an implementation substrate, and it is acceptable that chips are implemented on the implementation substrate.

Additionally, in the present embodiment, it is described that the photosensitive silicone resist fills in the via hole so that a cavity is formed in the hole to be the via hole. But it is acceptable that the cavity is not formed as long as any influence that the photosensitive silicone resist has when the photosensitive silicone resist grinds the semiconductor substrate is within a permissible range, and it is tolerable that the photosensitive silicone resist completely fills the hole to be the via hole.

As is apparent from the above explanation, by the semiconductor device according to the present invention, the photosensitive silicone resist fills in the via hole of the semiconductor substrate, and the photosensitive silicone resist is not removed. Therefore, the semiconductor device according to the present invention has the effect of realizing the semiconductor device that has no spurting out of an adhesive metal and prevents a defect at the time of manufacturing and its manufacturing method.

Consequently, by the present invention, it is possible to provide a semiconductor device that has no spurting out of an adhesive metal and prevents a defect at the time of manufacturing, and its manufacturing method. Therefore, its practical value is extremely high.

What is claimed is:

1. A semiconductor device comprising:
   a semiconductor substrate having a first-side surface, a second-side surface, and a via hole penetrating said semiconductor substrate from said first-side surface to said second-side surface;
   an electrode on said first-side surface of said semiconductor substrate and arranged so that a portion of said electrode extends to said second-side surface of said semiconductor substrate through said via hole; and
   a photosensitive resin formed over said first-side surface of said semiconductor substrate so as to cover at least a portion of said first-side surface including an aperture of said via hole, an area of said at least a portion being larger than an area of said aperture of said via hole, said photosensitive resin filling in said via hole to a depth less than an entire depth of said via hole.

2. The semiconductor device of claim 1, further comprising:
   a reverse-side electrode formed on said second-side surface of said semiconductor substrate;
   an adhesive metal formed on a surface of said reverse-side electrode such that said adhesive metal fills said via hole from an aperture of said via hole at said second-side surface to said photosensitive resin filled in said via hole; and
   an assembly substrate attached to said reverse-side electrode via said adhesive metal.

3. The semiconductor device of claim 2, wherein a main ingredient of said photosensitive resin is silicone resin or epoxy resin.

4. The semiconductor device of claim 2, wherein a viscosity of said photosensitive resin at 25° C. is in a range of 70 mPa·s to 600 mPa·s.

5. The semiconductor device of claim 1, wherein a main ingredient of said photosensitive resin is silicone resin or epoxy resin.

6. The semiconductor device of claim 1, wherein a viscosity of said photosensitive resin at 25° C. is in a range of 70 mPa·s to 600 mPa·s.

7. The semiconductor device of claim 1, further comprising an adhesive metal formed over said second-side surface of said semiconductor substrate such that said adhesive metal fills a portion of said via hole from an aperture of said via hole at said second-side surface to said photosensitive resin filled in said via hole.

* * * * *